US011502220B1

(12) United States Patent
Liao et al.

(10) Patent No.: US 11,502,220 B1
(45) Date of Patent: *Nov. 15, 2022

(54) ULTRAVIOLET LIGHT EMITTING DIODE STRUCTURES AND METHODS OF MANUFACTURING THE SAME

(71) Applicant: Trustees of Boston University, Boston, MA (US)

(72) Inventors: Yitao Liao, Redwood City, CA (US); Theodore D. Moustakas, Dover, MA (US)

(73) Assignee: Trustees of Boston University, Boston, MA (US)

( * ) Notice: Subject to any disclaimer, the term of this patent is extended or adjusted under 35 U.S.C. 154(b) by 49 days.

This patent is subject to a terminal disclaimer.

(21) Appl. No.: 16/781,876

(22) Filed: Feb. 4, 2020

Related U.S. Application Data

(60) Division of application No. 15/721,786, filed on Sep. 30, 2017, now Pat. No. 10,593,830, which is a
(Continued)

(51) Int. Cl.
*H01L 33/00* (2010.01)
*H01L 33/06* (2010.01)
(Continued)

(52) U.S. Cl.
CPC .......... *H01L 33/06* (2013.01); *H01L 33/0025* (2013.01); *H01L 33/0062* (2013.01);
(Continued)

(58) Field of Classification Search
CPC .................... H01L 33/005; H01L 33/0062
See application file for complete search history.

(56) References Cited

U.S. PATENT DOCUMENTS

| 4,727,341 A | 2/1988 | Nishi et al. |
| 5,057,881 A | 10/1991 | Lobentanzer et al. |
| (Continued) | | |

FOREIGN PATENT DOCUMENTS

| JP | 2000232259 A | 8/2000 |
| KR | 10108132 B1 | 2/2011 |
| WO | 2011104969 A1 | 9/2011 |

OTHER PUBLICATIONS

Fox et al., "Quantum Wells, Superlattices, and Band-Gap Engineering," Springer Handbook of Electronic and Photonic Materials, (2007); pp. 1021-1040, (Retrieved from and also available at ) https://www.researchgate.net/publication/227023978_Quantum_Wells_Superlattices_and_Band-Gap_Engineering.
(Continued)

*Primary Examiner* — Michele Fan
(74) *Attorney, Agent, or Firm* — Burns & Levinson LLP; Steven M. Mills

(57) ABSTRACT

Semiconductor structures involving multiple quantum wells provide increased efficiency of UV and visible light emitting diodes (LEDs) and other emitter devices, particularly at high driving current. LEDs made with the new designs have reduced efficiency droop under high current injection and increased overall external quantum efficiency. The active region of the devices includes separation layers configured between the well layers, the one or more separation regions being configured to have a first mode to act as one or more barrier regions separating a plurality of carriers in a quantum confined mode in each of the quantum wells being provided on each side of the one or more separation layers and a second mode to cause spreading of the plurality of carriers across each of the quantum wells to increase an overlap integral of all of the plurality of carriers. The devices and methods of the invention provide improved efficiency for
(Continued)

solid state lighting, including high efficiency ultraviolet LEDs.

6 Claims, 9 Drawing Sheets

Related U.S. Application Data division of application No. 14/846,485, filed on Sep. 4, 2015, now Pat. No. 9,780,254, which is a continuation of application No. 14/626,221, filed on Feb. 19, 2015, now Pat. No. 9,318,652, which is a continuation of application No. 14/250,941, filed on Apr. 11, 2014, now Pat. No. 8,987,755, which is a continuation of application No. 13/734,333, filed on Jan. 4, 2013, now Pat. No. 8,723,189.

(60) Provisional application No. 61/583,848, filed on Jan. 6, 2012.

(51) Int. Cl.
  *H01L 33/14* (2010.01)
  *H01L 33/04* (2010.01)
  *H01L 33/32* (2010.01)

(52) U.S. Cl.
  CPC ............ *H01L 33/04* (2013.01); *H01L 33/145* (2013.01); *H01L 33/32* (2013.01)

(56) References Cited

U.S. PATENT DOCUMENTS

| | | | |
|---|---|---|---|
| 5,132,981 A | 7/1992 | Uomi et al. | |
| 5,253,264 A | 10/1993 | Suzuki et al. | |
| 5,287,377 A | 2/1994 | Fukuzawa et al. | |
| 5,392,306 A | 2/1995 | Usami et al. | |
| 5,471,335 A | 11/1995 | Nitta | |
| 5,625,635 A | 4/1997 | Kurtz et al. | |
| 5,747,827 A | 5/1998 | Duggan et al. | |
| 6,437,361 B1 | 8/2002 | Matsuda | |
| 6,566,688 B1 | 5/2003 | Zhang et al. | |
| 7,345,324 B2 | 3/2008 | Bour et al. | |
| 7,498,182 B1 | 3/2009 | Sampath et al. | |
| 8,723,189 B1 | 5/2014 | Liao et al. | |
| 8,759,813 B2 | 6/2014 | Hirayama | |
| 8,987,755 B1 | 3/2015 | Liao et al. | |
| 2001/0024312 A1 | 9/2001 | Lee | |
| 2002/0053676 A1 | 5/2002 | Kozaki | |
| 2004/0051107 A1* | 3/2004 | Nagahama | H01L 21/02458 257/79 |
| 2004/0070810 A1 | 4/2004 | Yu et al. | |
| 2004/0113169 A1 | 6/2004 | Asami et al. | |
| 2004/0140531 A1 | 7/2004 | Werner et al. | |
| 2005/0211971 A1 | 9/2005 | Okumura | |
| 2005/0230701 A1 | 10/2005 | Huang | |
| 2005/0236627 A1 | 10/2005 | Kim et al. | |
| 2005/0242357 A1 | 11/2005 | Uematsu et al. | |
| 2006/0192218 A1 | 8/2006 | Kyono et al. | |
| 2007/0051937 A1 | 3/2007 | Kishino et al. | |
| 2007/0051939 A1 | 3/2007 | Nakahara et al. | |
| 2007/0075307 A1 | 4/2007 | Yoon et al. | |
| 2007/0080369 A1 | 4/2007 | Sakai | |
| 2007/0181895 A1 | 8/2007 | Nagai | |
| 2008/0081390 A1 | 4/2008 | Gaska et al. | |
| 2008/0099755 A1 | 5/2008 | Tansu et al. | |
| 2008/0149917 A1 | 6/2008 | Park | |
| 2008/0157102 A1 | 7/2008 | Hori et al. | |
| 2008/0308787 A1 | 12/2008 | Lee et al. | |
| 2009/0206320 A1 | 8/2009 | Chua et al. | |
| 2009/0278113 A1 | 11/2009 | Chung et al. | |
| 2009/0280592 A1 | 11/2009 | Chen et al. | |
| 2009/0302308 A1 | 12/2009 | Chua et al. | |
| 2010/0019223 A1 | 1/2010 | Kang et al. | |
| 2010/0187496 A1 | 7/2010 | Yan | |
| 2010/0270532 A1 | 10/2010 | Takano et al. | |
| 2010/0288998 A1* | 11/2010 | Kikuchi | H01L 33/06 257/13 |
| 2011/0101301 A1 | 5/2011 | Lin et al. | |
| 2011/0187294 A1 | 8/2011 | Bergmann et al. | |
| 2011/0272667 A1 | 11/2011 | Takayama | |
| 2012/0007040 A1 | 1/2012 | Moon et al. | |
| 2012/0138890 A1 | 6/2012 | Shioda et al. | |
| 2012/0161103 A1 | 6/2012 | Peter et al. | |
| 2012/0201264 A1 | 8/2012 | Shatalov et al. | |
| 2012/0217471 A1 | 8/2012 | Shioda et al. | |
| 2013/0069034 A1 | 3/2013 | Hirayama | |

OTHER PUBLICATIONS

Jimerik et al., "AlGaN-based quantum-well heterostructures for deep ultraviolet light-emitting diodes grown by submonolayer discrete plasma-assisted molecular-beam epitaxy," Semiconductors, 2008, vol. 42, No. 12, pp. 1420-1426.

Miller, "Opical Physics of Quantum Wells," Stanford University, (1996); pp. 1-28 (Retrieved from ) https://ee.stanford.edu/~dabm/181.pdf or https://www.researchgate.net/publication/260403078_Optical_Physics_of_Quantum_Wells.

* cited by examiner

ULTRAVIOLET LIGHT EMITTING DIODE STRUCTURES AND METHODS OF MANUFACTURING THE SAME

CROSS REFERENCE TO RELATED APPLICATIONS

This application claims the benefit under 35 U.S.C. § 120 of and is a divisional of U.S. patent application Ser. No. 15/721,786 filed Sep. 30, 2017, to be issued as U.S. Pat. No. 10,593,830, the entire disclosure of which is incorporated herein, which is a divisional of U.S. patent application Ser. No. 14/846,485 filed Sep. 4, 2015, now U.S. Pat. No. 9,780,254 issued Oct. 3, 2017, the entire disclosure of which is incorporated herein, which is a continuation of U.S. patent application Ser. No. 14/626,221 filed Feb. 19, 2015, now U.S. Pat. No. 9,318,652 issued Apr. 19, 2016, the entire disclosure of which is incorporated herein, which is a continuation of U.S. patent application Ser. No. 14/250,941 filed Apr. 11, 2014, now U.S. Pat. No. 8,987,755 issued Mar. 24, 2015, the entire disclosure of which is incorporated herein, which is a continuation of U.S. patent application Ser. No. 13/734,333 filed Jan. 4, 2013, now U.S. Pat. No. 8,723,189 issued May 13, 2014, the entire disclosure of which is incorporated herein, which is a non-provisional of U.S. Provisional Patent Application No. 61/583,848 filed Jan. 6, 2012, the entire disclosure of which is incorporated herein, all entitled ULTRAVIOLET LIGHT EMITTING DIODES STRUCTURES AND METHOD OF MANUFACTURING THE SAME.

STATEMENT REGARDING FEDERALLY SPONSORED RESEARCH OR DEVELOPMENT

This invention was made with Government Support under Contract No. W911NF-06-2-0040 awarded by the Army Research Office. The Government has certain rights in the invention.

BACKGROUND OF THE INVENTION

LEDs based on InAlGaN multiple quantum wells (MQWs) generally suffer from two problems. The first is the so called "Quantum Confined Stark Effect" (QCSE), which is due to internal electric fields caused by spontaneous and piezoelectric polarization. Specifically, this internal electric field distort the MQWs and as a result the overlap of the electron and hole wave functions is reduced, leading to reduced internal quantum efficiency (IQE). The second prominent problem is the efficiency reduction at high injection current density, which is known as "efficiency droop".

Although LEDs have enjoyed commercial success in the display backlighting market, a major barrier for LEDs to enter the general lighting market is the problem of efficiency droop. Compared with traditional lighting products such as incandescent or florescent light bulbs, white LEDs have higher energy efficiency in converting electrical power input to optical power output. However, currently this is only the case when the LEDs operate at relatively low current densities. At high current density, the efficiency of LEDs is reduced, and the optical output power eventually saturates and decreases. To further reduce the cost per lumen, the ability to obtain high optical output power from single LED devices is needed.

Similarly, in the case of UV-LEDs, to enter large markets such as industrial curing and water purification, having a single LED that operates with high efficiency at high injection current conditions is also critical. To date, commercial UV-LEDs emitting in the UV-C range required for disinfection (<300 nm) can only operate at below 30 mA, where the output power from a single device is limited to a few hundred microwatts. Also, the radiative efficiency of UV-LEDs reduces drastically when they are operated at high current densities, where most of the input electrical energy is lost in device heating, eventually leading to device failure.

To date, multiple mechanisms have been proposed to explain the efficiency droop, including carrier delocalization, auger recombination and carrier overflow. While all of these mechanisms offer reasonable physics-based explanations for efficiency droop, no consensus on which one is the most plausible cause has been reached yet. Nevertheless, direct correlation can be established between efficiency droop and current density (to be more specific, the carrier density in quantum wells of the active region). In other words, it is only at high current densities when the quantum wells are populated with excess carriers (electrons in the conduction band and holes in the valence band) that the efficiency starts to decrease. Therefore, reducing the current density and/or reducing the carrier overflow in an LED device, while at the same time achieving high output power, are natural solutions to efficiency droop.

A number of methods have been employed to reduce the current density in LEDs. The current density at which an LED operates is defined as the injection current (measured in Amperes) divided by the area of the LED die (measured by centimeter squared). A simple solution to reduce the current density of the LED device, and therefore reduce the carrier density of the active region, is to increase the area of the LED chip (i.e. chip size). Large-area chip LEDs (usually defined as chip area larger than 1 $mm^2$) can endure higher drive current compared to small chip size (smaller than 1 $mm^2$), and therefore can produce higher optical output power. However, increasing the chip size will inevitably reduce the number of LEDs that can be produced from an LED wafer, which increases significantly the cost of LED production. Furthermore, in case of UV-LEDs, the resistivity of the n-type AlGaN layer limits the current spreading length of such devices, and therefore only the peripheries of the large-size chip will produce light from electron-hole recombination while the center area of the LED will not produce light. Because of these drawbacks in both cost and performance, simply using large size chip is not considered a viable solution to efficiency droop, particularly in UV-LEDs.

Another solution that has been adopted recently in the blue LED domain is to increase the thickness of the well layer and therefore reduce the carrier overflow in the quantum well in the active region. However, such thick quantum wells suffer from strong electron-hole wave function separation, due to strong QCSE induced by built-in polarity in nitride materials, and therefore reduce the IQE of such devices. Recently, there have been considerable new developments in producing thick quantum wells on non-polar or semi-polar substrates, and therefore removing or reducing the spontaneous polarization and the QCSE. However, though non-polar and semi-polar nitride epitaxy technology has achieved great success recently in the InGaN material system for blue-violet LED with reduced efficiency droop, in the AlGaN material system for ultraviolet LEDs the non-polar and semi-polar technologies are still under development. Current AlGaN epilayers grown on non-polar or semi-polar substrates suffer from high defect density and are difficult to dope efficiently. In addition, to maximize the injection efficiency in UV-LEDs, one needs to rely on polarization doping techniques in order to overcome the large ionization energies of n- and p-type dopants in wide bandgap semiconductors.

Alternatively, instead of using thick quantum well layers in the active region, one can also increase the number of quantum wells in the active region, where the carriers are distributed in a number of quantum wells. However, while such a method may seem viable in the case of blue-violet LEDs, it is not applicable for reduction of efficiency droop in UV-LEDs. The holes in AlGaN material have very high effective mass, and small mobility and diffusion length. Therefore, the holes cannot easily be transported from one well to another after populating the quantum well adjacent to the electron blocking layer. Therefore, increasing the number of quantum wells in UV-LEDs will lead to uneven carrier distribution across the wells, and electron-hole separation in different quantum wells, and therefore will reduce the IQE of UV-LEDs.

Thus, there remains a need to improve the efficiency of visible and UV LEDs, particularly at high injection current density.

BRIEF SUMMARY OF THE INVENTION

In this invention, new epitaxial designs are presented for UV and visible light LEDs which reduce efficiency droop and which also increase overall external quantum efficiency (EQE). This is accomplished by designing the active region such that the potential energy height and/or the thickness of the inner barrier layers ("tunable inner barrier" or TIB layers) is optimized to improve overlap of the electron and hole wave-functions, with consequent reduction in the QCSE. Simultaneously, the epitaxial design of the invention allows for high carrier concentration in the wells without using thick individual well layers, and thus reduces the efficiency droop of LEDs under high current injection.

One aspect of the invention is a semiconductor structure for an active region of a light emitting device. The structure contains two or more well layers, one or more inner barrier layers separating the well layers, and two outer barrier layers disposed on the opposite sides of the well layers from the inner barrier layers. The inner barrier layers differ from the outer barrier layers in thickness and/or potential energy level.

Another aspect of the invention is a semiconductor light emitting device. The device includes a substrate, a buffer layer, an n-doped layer, the semiconductor structure described above, an electron blocking layer, and a p-doped layer. In certain embodiments the device is a visible or ultraviolet light emitting diode (LED).

Yet another aspect of this invention is a method of designing the active region (e.g., multiple quantum wells (MQW)) of a semiconductor light emitting device, such as an LED. The layers of the active region are designed to achieve improved electron-hole wave-function overlap and carrier transport. The resulting epitaxial design can be used to produce the semiconductor structure or semiconductor device described above. The method involves tuning the TIB layer within certain ranges of thickness and/or potential energy level with respect to the outer barrier layers of the active region. In one embodiment for designing a UV-LED, the design starts from a desired LED emission wavelength, chooses the appropriate AlN mole fraction in the well layers and outer barrier layers for that emission wavelength, and selects a tuning mechanism for the TIB layer (i.e., thickness, potential energy, or both). The resulting epitaxial design defines the MQW structure and optimizes device performance, achieving reduced efficiency droop at high current operation.

Still another aspect of the invention is a method of fabricating the semiconductor structure described above. The method includes the following steps: (a) providing a base semiconductor structure comprising a substrate, a buffer layer deposited on the substrate, and one or more n-type layers deposited on the buffer layer (the buffer layer and n-type layers contain III-N semiconductor material); (b) fabricating the semiconductor structure on the base semiconductor structure by a process including the following steps: (b1) depositing a first outer barrier layer onto the n-type layer; (b2) depositing a first well layer onto the first outer barrier layer; (b3) depositing an inner barrier layer onto the first well layer; (b4) depositing a second well layer onto the inner barrier layer; (b5) optionally depositing one or more additional inner barrier layers and well layers onto the second well layer; and (b6) depositing a second outer barrier layer onto the second well layer or an uppermost additional well layer.

Another aspect of the invention is a method of fabricating the semiconductor light emitting device described above. The method includes the steps of: (a) depositing a buffer layer onto a substrate; (b) depositing an n-type layer onto the buffer layer; (c) depositing a first outer barrier layer onto the n-type layer; (d) depositing a first well layer onto the first outer barrier layer; (e) depositing an inner barrier layer onto the first well layer; (f) depositing a second well layer onto the inner barrier layer; (g) optionally depositing one or more additional inner barrier layers and well layers onto the second well layer; (h) depositing a second outer barrier layer onto the second well layer or an uppermost additional well layer. (i) depositing an electron blocking layer onto the second outer barrier layer; and (j) depositing a p-type layer onto the electron blocking layer.

In a specific embodiment, the present invention provides a light emitting diode device for emission of electromagnetic radiation in an ultraviolet wavelength range. The device includes a semiconductor substrate comprising a surface region and a semiconductor structure overlying the surface region. The semiconductor structure is an active region of the light emitting device. The structure comprises two or more well layers, one or more separation layers configured between the well layers. The one or more separation regions are configured to have a first mode to act as one or more barrier regions separating a plurality of carriers in a quantum confined mode in each of the quantum wells being provided on each side of the one or more separation layers and a second mode to cause spreading of the plurality of carriers across each of the quantum wells to increase an overlap integral of all of the plurality of carriers from a first value to a second value. The second value is greater than the first value, and the first value is associated with the first mode and the second value is associated with the second mode.

In an example, the present invention provides a method of fabricating a light emitting diode device for emission of electromagnetic radiation in an ultraviolet wavelength range. The method includes providing a semiconductor substrate comprising a surface region. The method includes forming a semiconductor structure overlying the surface region. The semiconductor structure is an active region of the light emitting device. The structure comprises two or more well layers, one or more separation layers configured between the well layers. The one or more separation regions is configured to have a first mode to act as one or more barrier regions separating a plurality of carriers in a quantum confined mode in each of the quantum wells being provided on each side of the one or more separation layers and a second mode to cause spreading of the plurality of carriers across each of the quantum wells to increase an overlap integral of all of the plurality of carriers from a first value to a second value, which is greater than the first value. The first value is associated with the first mode and the second value is associated with the second mode.

In an example, the term first mode and second mode should be interpreted by ordinary meaning and does not necessarily imply order, although can be ordered sequentially. The term mode generally refers to a given condition of functioning as described, although there may be other meanings consistent with ordinary meaning.

In an example, each of the first mode and the second mode is provided by a thickness and/or potential energy level of each of the separation layers. In an example, the second mode relates to a higher energy efficiency than an energy efficiency of the device operating in the first mode when operating each mode in a same current density such that the second mode increases an overlap integral of the plurality of carriers from a first value to a second value. In an example, one or more separation layers comprises a plurality of layers. Each of the layers is substantially the same in thickness and energy, or different in thickness or energy, or an outer pair of each of the separation layers is substantially the same in thickness and energy and an inner separation layer sandwiched between the outer pair is different from the inner outer separation layer.

In an example, the device comprises an n-doped layer on an n-doped side of the structure and a p-doped layer on a p-doped side of the structure, and the thicknesses and/or potential energy levels of the separation layers form a gradient (e.g., continuous, varied, patterned) between the n-doped side of the structure and the p-doped side of the structure. In an example, the gradient increases in thickness and/or potential energy level from the n-doped side to the p-doped side or the gradient increases in thickness and/or potential energy level from the p-doped side to the n-doped side.

In an example, each of the separation layers comprise a first III-N material having the formula M1N and a second III-N material having the formula M2N, wherein M1 and M2 are different group III elements. In an example, each of the separation layers comprises AlGaN material or AlInGaN material. In an example, each of the separation layers is about 0.5 nm to about 3 nm in thickness. In an example, each of the separation layers is tunable to optimize overlap of electron and hole wave functions over the active region.

In an example, the light emitting diode device is selected from an LED or laser or multiple quantum well structure using an external pumping source, the external pumping source being selected from a laser, electron beam, or other electromagnetic source. In an example, the one or more well layers is provided subjecting the n-type material to a flux of an elemental gallium material to cause formation of a thickness of gallium material, transferring elemental aluminum material from an aluminum source, transferring a nitrogen species from a nitrogen source; causing formation of a crystalline aluminum, gallium, and nitrogen containing material (AlGaN) overlying the n-type material to form an active region, and maintaining the process chamber under a vacuum environment of no greater than 10−1 Torr.

DETAILED DESCRIPTION OF THE INVENTION

The inventors have developed LEDs with new MQW epitaxial designs using tunable inner barrier (TIB) layers to increase the overlap of the electron and hole wave functions and improve electron and hole transport, and thus minimize the efficiency degrading QCSE. An additional advantage of the MQW design of the invention is the ability to operate at high current density without significant efficiency reduction.

The tuning of the TIB layers can be accomplished in two different ways: one is by controlling their potential energy level and the other is by controlling their thickness. A combination of both approaches also can be used. Specific choices of the TIB thickness or potential energy or both depend on the desired emission wavelength of the MQW in an LED.

In an embodiment of this invention, new epitaxial designs were developed for UV-LEDs to reduce the efficiency droop and also to increase overall external quantum efficiency (EQE). This was accomplished by employing MQWs in which the potential energy height and/or the thickness of the TIB layers is optimized for maximum overlap of the electron and hole wave-functions in order to minimize the QCSE. Such MQW designs simultaneously allow for high carrier concentration in the wells without using thick individual well layers, and thus reduces the efficiency droop of UV-LEDs under high current injection.

According to one method of the invention, a UV-LED MQW region can be designed with improved electron-hole wave-function overlap and carrier transport by tuning the TIB layer within certain ranges. One can start from the desired UV-LED emission wavelength, choose the AlN mole fraction in the well layer and outer barrier layers, and decide on the tuning mechanism of the TIB layer (thickness, potential energy, or both) to define a MQW structure for optimized device performance with low efficiency droop at high current operation.

Figure 1:
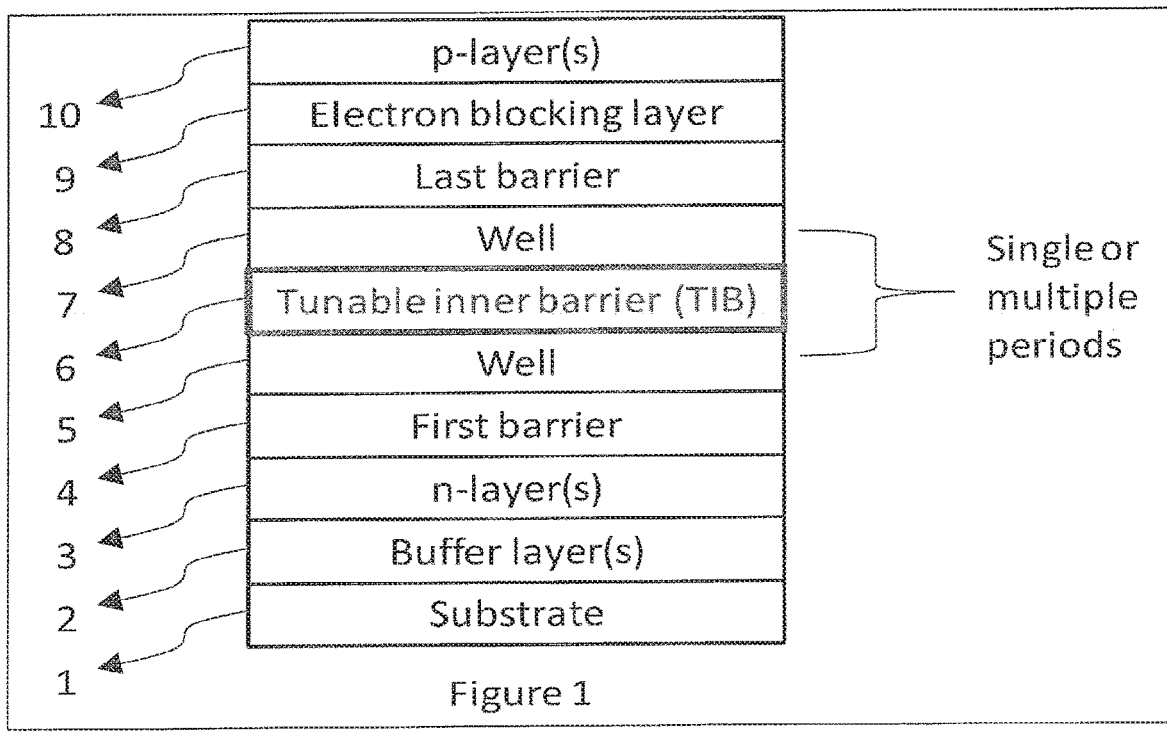
FIG. 1 shows a schematic representation of the epitaxial structure of an embodiment of a UV-LED according to the invention.

LEDs based on InAlGaN MQWs with inner barrier layer with varying potential energies and thicknesses presented in this invention contain a number of layers grown on a substrate. A schematic showing a typical epitaxial structure for a UV-LED is shown in FIG. 1.

The substrate (1) contains or consists essentially of a material selected from c-sapphire, a-sapphire, m-sapphire, r-sapphire, c-AlN, a-AlN, m-AlN, r-AlN, (001) Si, (111) Si, c-SiC, a-SiC, m-SiC, r-SiC, c-ZnO, a-ZnO, m-ZnO, r-ZnO, glass and quartz. The first layer grown on the substrate consists of one or more buffer layers (shown as layer 2) containing a III-N material such as AlN, AlGaN, InAlGaN, or GaN or any of their combinations (polycrystalline, single crystalline or mixed, and multiple layers of these three types) approximately from 10 nm to 100 microns. In case of AlN or AlGaN buffer layers, the role of the buffer layer(s) is to establish a quasi-nitride substrate on which the AlGaN film can be grown under compressive stress with reduced density of threading dislocations and high crystalline quality.

The second growth layer (layer 3) is s film containing $Al_aGa_{1-a}N$ doped n-type with Si, Ge or other potential n-type dopants. The film is of thickness between 100 nm and 10 microns, and is grown directly on the buffer layer(s). Depending on the intended emission wavelength, the AlN mole fraction ("a" in the formula $n-Al_aGa_{1-a}N$) varies from 0% for a device emitting at 360 nm, to 100% for a device designed to emit at 210 nm. The $n-Al_aGa_{1-a}N$ film can also contain a variety of possible AlGaN layer stacks or stack combinations, including, but not limited to the following two embodiments: (1) $n-Al_bGa_{1-b}N$ layers doped at different silicon impurity levels and their combinations. In a typical embodiment, a three-layer stack structure consisting of n-type $Al_bGa_{1-b}N$ layer doped with silicon to have free electron concentration of $1\times10^{17}$ $cm^{-3}$, $5\times10^{18}$ $cm^{-3}$, and $1\times10^{19}$ $cm^{-3}$, with corresponding thicknesses of 1 µm, 500 nm and 300 nm, respectively. (2) On top of the $n-Al_bGa_{1-b}N$ layer and layer stacks, a multiple layer stack structure can be grown, with thin individual layers (e.g., 0.1 nm to 100 nm) that have different AlN mole fractions. This creates variations of the AlN mole fraction along the growth direction. The layers can be doped with silicon across the entire layer stack structure. In one embodiment, a three layer structure includes a first layer containing $n-Al_cGa_{1-c}N$ (on top of the last $n-Al_aGa_{1-a}N$ layer) of lower AlN mole fraction than the last $n-Al_aGa_{1-a}N$ layer, i.e., c<a, a second layer containing $n-Al_dGa_{1-d}N$ of higher AlN mole fraction than the first layer (d>c), and a third layer containing $n-Al_eGa_{1-e}N$ of lower AlN mole fraction than the second layer (e<d). All three layers can be doped with silicon. The silicon impurity level in these three layers can be the same, or higher in the first and third layers than in the second.

The active region (multiple quantum well (MQW) region) of the UV-LED structure is grown on top of the last $n-Al_aGa_{1-a}N$ layer, and consists of at least two $Al_xGa_{1-x}N/Al_yGa_{1-y}N$ (0<x<y<1) MQWs. The MQWs start with a first barrier layer $Al_{y1}Ga_{1-y1}N$ (layer 4) on top of the last $n-Al_aGa_{1-a}N$ layer, where y1 can have AlN mole fraction in the entire alloy composition (0<y1<1), and the thickness of layer 4 is in the range from 0.1 nm to 100 nm. On top of layer 4, a first quantum well layer $Al_{x1}Ga_{1-x1}N$ layer (layer 5) is grown with lower AlN mole fraction than layer 4 (0<x1<y1<1), and the thickness of layer 5 is in the range from 0.1 nm to 10 nm. The thickness of the first quantum well layer preferably is set to be thin (less than 10 nm) to avoid strong QCSE effect. On top of the first quantum well layer (layer 5), a tunable inner barrier (TIB) layer $Al_{y2}Ga_{1-y2}N$ (layer 6) is grown. The TIB layer is inserted in between the quantum well layers (layer 5 and layer 7) to optimize electron and hole wave-function overlap, carrier transport and spreading across the individual quantum wells, reduce carrier concentration in the individual quantum wells at given operation current density, and thus reduce the efficiency droop of UV-LEDs under high current injection. The TIB layer is different from the first and last barrier layers (layer 4 or layer 8) in either its potential energy level (controlled by the alloy composition) or the layer thickness, or both. After the TIB layer, a second quantum well layer $Al_{x2}Ga_{1-x2}N$ layer (layer 7, 0<x2<y2<1) is grown, and the thickness of layer 7 is in the range from 0.1 nm to 10 nm. The thickness of the first quantum well layer preferably is set to be thin (less than 10 nm) to avoid strong QCSE effect. After layer 7 a second barrier layer $Al_{y3}Ga_{1-y3}N$ layer (layer 8) is grown as the last barrier layer of the multiple quantum well regions. Layer 8 has higher AlN mole fraction than that of the last well layer (layer 7) to provide quantum confinement (0<x2<y3<1). The thickness of layer 8 is in the range from 0.1 nm to 10 nm. Layers 4 and 8 constitute the outer barrier layers, which are the first and last barrier layers of the active region, and which are disposed on the opposite side of the first and last well layers from the respective inner barrier layers.

The TIB layer also can be composed of material other than AlGaN. For example, the TIB layer can include AlGaInP, AlGaInN, or ZnO.

There can be two or more (i.e., multiple) periods of the layers 5, 6, and 7, where each pair of sequential quantum well layers is separated by a TIB layer sandwiched in between the two well layers. For example, another TIB layer can be grown on top of layer 7 and another well layer on top of the second TIB layer, and this cycle can be repeated as often as desired to produce a multiple quantum well structure, which is then terminated with the last or uppermost barrier layer 8. In case that multiple periods of the layers 5, 6, and 7 are used in the active region, the TIB layers can have different thicknesses and potential energies. The TIB layer thicknesses and potential energies are different from the thicknesses and potential energies of the first barrier layer (layer 4) and last barrier layer (layer 8).

On the top of the last barrier of the active region, a p-type doped (e.g., Mg-doped) $Al_fGa_{1-f}N$ film (layer 9), with AlN mole fraction equal to or higher than that used in the last barrier (layer 8) (0<y3≤f≤1), is grown with thickness in the range of 1 to 100 nm. The role of this layer (commonly referred to as the electron blocking layer) is to prevent electrons injected from the n-side into the active region from reaching the p-side of the LED structure.

Following the electron blocking layer, one or more p-type doped (e.g., Mg-doped) $Al_gGa_{1-g}N$ layers (layer 10) are deposited. Layer 10 can be a single layer or multiple layers of AlGaN film with AlN mole fraction from 0 to 100% and thickness from 2 nm to 500 nm. In one embodiment, a Mg-doped pure GaN material is used as layer 10, grown on top of layer 9. Layer 10 serves as the contact layer where contact metal stacks are deposited to form p-ohmic contacts to the LED structure. In another embodiment, a Mg-doped $Al_hGa_{1-h}N$ layer is grown on layer 9. The AlN mole fraction of this embodiment of layer 10 is half of the AlN mole fraction of layer 9 (h=0.5*g). After this layer, a Mg-doped pure GaN material is grown as the p-contact layer. The insertion of the $p-Al_hGa_{1-h}N$ layer forms a strong polarization field at the interfaces of layer $9/p-Al_hGa_{1-h}N$ and $p-Al_hGa_{1-h}N/p-GaN$, where the Mg dopant activation is very efficient and thus high free hole concentration can be achieved.

The present invention also provides methods of designing the TIB layer. Two exemplary methods and a third represented by their combination will now be described. However, these embodiments are merely examples and do not represent all possible UV-LED designs that can be obtained using the present TIB technology.

Method 1

The thickness of the TIB layer is designed to optimize the wave-function overlap across the well layers of the active region. The potential energy level of the TIB layer is the same as that of the first or last barrier layer. The thickness of the TIB layer is between 0.1 nm to 10 nm, depending on the LED emission wavelength. The thickness of the TIB layer controls how the wave-function and carriers are distributed. The optimal thickness of the TIB layer is identified by even distribution of the wave-functions and carriers (electrons and holes) across the well layers, which effectively suppresses the QCSE.

Table 1 provides example ranges of suitable first and last (i.e., outer) barrier thicknesses as a function of the emission wavelength range of the LED.

TABLE 1

| LED emission wavelength (nm) | Upper thickness limit (nm) | Lower thickness limit (nm) | Preferred thickness (nm) |
| --- | --- | --- | --- |
| 340 to 360 | 15 | 5 | 8 |
| 320 to 340 | 8 | 4 | 6 |
| 300 to 320 | 7 | 2 | 4 |
| 280 to 300 | 6 | 1.5 | 3 |
| 260 to 280 | 5 | 1 | 3 |
| 240 to 260 | 4 | 1 | 2 |
| 220 to 240 | 3 | 0.5 | 1 |

TABLE 2 provides example ranges of suitable TIB layer thickness as a function of the emission wavelength range of the LED.

| LED emission wavelength (nm) | Upper thickness limit (nm) | Lower thickness limit (nm) | Preferred thickness (nm) |
| --- | --- | --- | --- |
| 340 to 360 | 8 | 3 | 5 |
| 320 to 340 | 7 | 3 | 4 |
| 300 to 320 | 5 | 2 | 3 |
| 280 to 300 | 4 | 1 | 2 |
| 260 to 280 | 3 | 1 | 1 |
| 240 to 260 | 3 | 0.5 | 1 |
| 220 to 240 | 2 | 0.1 | 0.5 |

Figure 2:
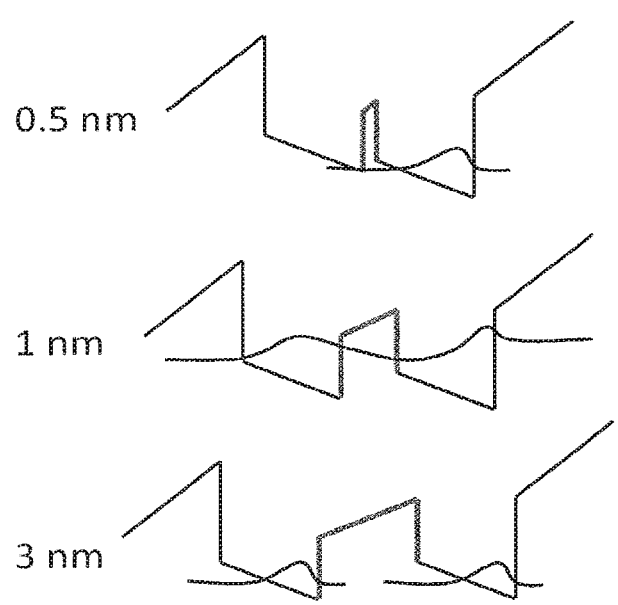
FIG. 2 shows a representation of the potential energy profiles and electron and hole wave functions of three embodiments of LED active regions with different thickness of the inner barrier layer.

For one embodiment of a UV-LED emitting between 260 nm and 280 nm, the active region energy band structure is shown schematically in FIG. 2. Using the optimal thickness of the TIB layer of 1 nm, the wave-functions are evenly distributed in the well layers. When the TIB layer is 3 nm, carrier transport and spreading from one well layer to another well layer is not efficient, as can be seen by the fact that the wave-functions in the well layers are decoupled and separated. In this case, since the electrons and holes are injected from different sides of the active region, one well may be filled with more electrons and another may be filled with more holes, and therefore wave function overlap across the active region is reduced, which leads to reduced IQE. Since the holes in UV-LEDs can only fill the nearest well adjacent to the p-layers, effectively only one well contributes to electron-hole recombination, and therefore the carrier density is high in this well, which leads to pronounced efficiency droop. When the TIB layer is 0.5 nm, the wave-functions in the well layers are mostly localized in one well layer while de-localized in another. In this case the electron and hole wave-functions will be strongly separated due to QCSE, which therefore produces low IQE. However, since the quantum well thickness is effectively doubled, which leads to less carrier overflow, the efficiency droop is less pronounced than in the case when the TIB layer is 3 nm.

Method 2

The AlN mole fraction of the TIB layer is set to a value less than the AlN mole fraction of the first and last barrier layers to optimize the even distribution of the wave-functions among the well layers. In this embodiment, the TIB layer and the first/last barrier layers have the same thickness. The AlN mole fraction of the TIB layer controls the carrier transport and spreading from one well layer to another, and the degree of coupling among the well layers, and how the wave-function and carriers are distributed. The range of the AlN mole fraction in the TIB layer, as well as the AlN mole fraction in the first/last barrier layers and well layers, are determined by the LED emission wavelength. The preferred AlN mole fraction of the TIB layer is characterized by an even distribution of the wave-function and carriers (electrons and holes) across the well layers.

TABLE 3 provides example ranges of suitable AlN mole fractions of the quantum well determined by the emission wavelength range of the LED.

| LED emission wavelength (nm) | Upper AlN mole fraction | Lower AlN mole fraction | Preferred AlN mole fraction |
| --- | --- | --- | --- |
| 340 to 360 | 20 | 0 | 5 |
| 320 to 340 | 35 | 10 | 15 |
| 300 to 320 | 45 | 20 | 35 |
| 280 to 300 | 65 | 30 | 50 |
| 260 to 280 | 80 | 40 | 65 |
| 240 to 260 | 90 | 65 | 75 |
| 220 to 240 | 100 | 70 | 85 |

TABLE 4 provides example ranges of suitable AlN mole fraction of the first and the last barrier layers as a function of the emission wavelength range of the LED.

| LED emission wavelength (nm) | Upper AlN mole fraction | Lower AlN mole fraction | Preferred AlN mole fraction |
| --- | --- | --- | --- |
| 340 to 360 | 30 | 10 | 15 |
| 320 to 340 | 45 | 20 | 25 |
| 300 to 320 | 60 | 30 | 45 |
| 280 to 300 | 75 | 40 | 60 |

TABLE 4-continued provides example ranges of suitable AlN mole fraction of the first and the last barrier layers as a function of the emission wavelength range of the LED.

| Table 4 LED emission wavelength (nm) | Upper AlN mole fraction | Lower AlN mole fraction | Preferred AlN mole fraction |
|---|---|---|---|
| 260 to 280 | 90 | 50 | 75 |
| 240 to 260 | 100 | 60 | 85 |
| 220 to 240 | 100 | 80 | 95 |

TABLE 5 provides example ranges of suitable AlN mole fractions of the TIB layer as a function of the emission wavelength range of the LED.

| Table 5 LED emission wavelength (nm) | Upper AlN mole fraction | Lower AlN mole fraction | Preferred AlN mole fraction |
|---|---|---|---|
| 340 to 360 | 25 | 5 | 10 |
| 320 to 340 | 40 | 15 | 20 |
| 300 to 320 | 50 | 25 | 30 |
| 280 to 300 | 70 | 35 | 55 |
| 260 to 280 | 85 | 45 | 70 |
| 240 to 260 | 95 | 70 | 80 |
| 220 to 240 | 100 | 75 | 90 |

Figure 3:
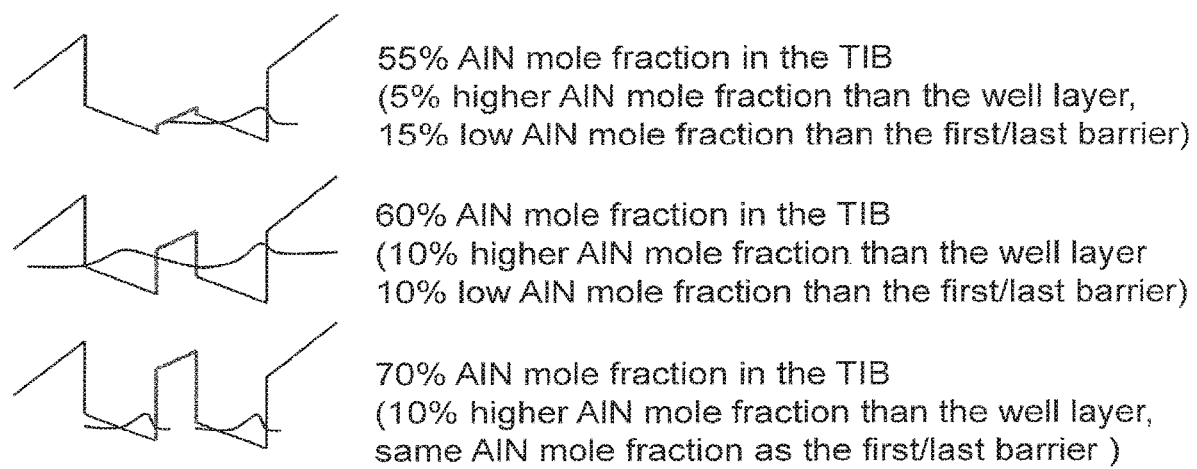
FIG. 3 shows a representation of the potential energy profiles and electron and hole wave functions of three embodiments of LED active regions with different potential energy levels of the inner barrier layer.

One embodiment of a 285 nm peak emission UV-LED with TIB layer is shown schematically in FIG. 3. The quantum well AlN mole fraction is 50%, and the first/last barrier AlN mole fraction is 70%. The optimal AlN mole fraction offset of the TIB layer to the well layers is 60%, and the wave-functions in the well layers are evenly distributed and strongly overlapped. When the offset of the AlN mole fraction in the TIB layer is 70% (same as the first/last barrier AlN mole fraction), carrier transport and spreading from one well layer to another is inhibited and not efficient, and the wave-functions in the well layers are decoupled and separated. In this case, since the electrons and holes are injected from different sides of the active region, one well is filled with more electrons and another is filled with more holes, and therefore the IQE is reduced and efficiency droop will occur. When the offset of the AlN mole fraction in the TIB layer is 55%, the wave-functions in the well layers are mostly localized in one well layer and delocalized in another. In this case the electron and hole wave-functions will be strongly separated due to QCSE, and therefore low IQE and droop will occur.

The results shown in the Examples validated the effects of using a TIB layer to control the wave-function overlap (carrier distribution) across the well layers. The effects observed include the following.

(1) Reduced efficiency droop by improving carrier transport and spreading from one well layer to another, and having carriers distributed evenly across multiple wells instead of individual well layers preferentially filled by electrons and holes from opposite sides.

(2) Reduced UV-LED efficiency droop where after the EQE reached its peak value at a lower carrier density remained stable at the same level at higher carrier densities.

(3) Improved output power of UV-LED from a single chip of the same size, where with increasing drive current density, the LED with optimal TIB layer design and reduced efficiency droop exhibit linear output power increase and the LED with efficiency droop exhibit output power saturation.

(4) The optimal device performance is achieved when the carrier distribution is even across the wells. Devices with thick TIB layers and therefore uneven carrier distribution show strong efficiency droop and output power saturation at low current density, while a too thin TIB layer results in strong QCSE and wave-function delocalization, which leads to significantly lower EQE independent of the efficiency droop behavior.

In the case where MQWs with more than 2 well layers are used in the active region, the TIB layers can have different thicknesses and/or potential energies to best optimize carrier transport from one well to another.

The semiconductor structures and devices produced according to the invention have multiple uses. For example, an active region including one or more TIB layers can be used in other semiconductor devices in addition to visible LEDs and UV-LEDs. Additional devices include semiconductor lasers, optical detectors, modulators, and transistors. Solid-state ultraviolet light sources can be made with single chip output power exceeding 10 mW; these could replace mercury lamps in biomedical research, medical treatment, and sterilization applications. Solid-state ultraviolet light sources can be made that are frequency-, amplitude- or phase-modulated; these can be applied in non-line-of-sight free-space communications. Solid-state ultraviolet light sources can be made are used to cure epoxy materials, for tanning, for currency and banknote counterfeit detection, for water purification and for photocatalytic air purification.

It is important to note that Tables 1-5 above, and the further examples which follow, only offer description of design parameters for particular UV-LED embodiments which are provided as illustrative and working examples, and are not intended to limit the range of such parameters for the invention.

EXAMPLES

Example 1. Effect of Tunable Barrier Layer Thickness on EQE and Output Power

Figure 4:
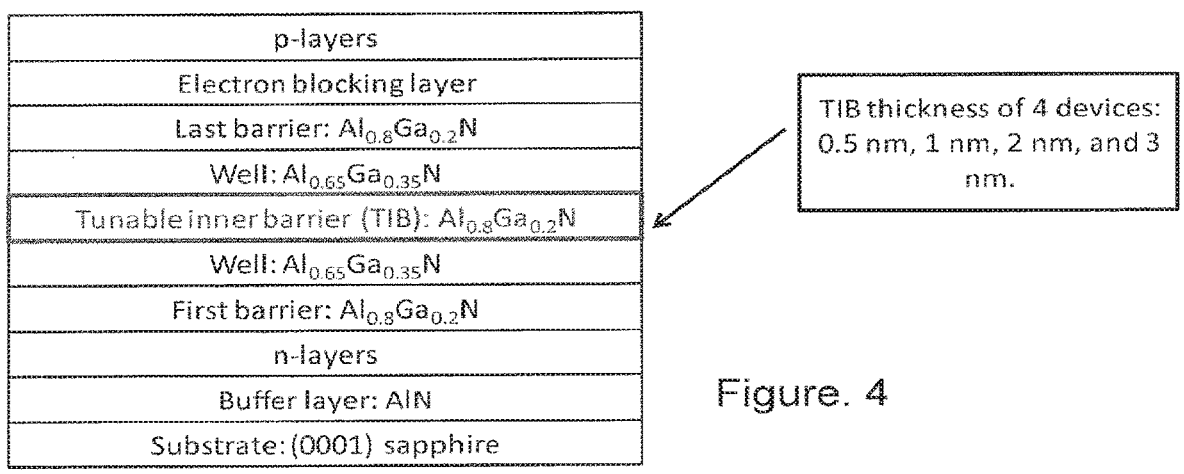
FIG. 4 shows a schematic representation of the epitaxial structure of embodiments of a UV-LED having different inner barrier layer thickness.

In this example, results are presented for a series of 280 nm band deep UV LEDs fabricated using identical epitaxial design except for the thicknesses of the TIB layer, which was varied. The epitaxial design of these LEDs is schematically shown in FIG. 4. The AlN mole fraction of the MQW well and barrier layers were within the ranges specified in Tables 3 and 4.

The TIB layer fabricated with $Al_{0.8}Ga_{0.2}N$ was inserted between two well layers, each having the same AlN mole fraction and fabricated with $Al_{0.65}Ga_{0.35}N$. The TIB layer had the same AlN mole fraction as the first/last barrier layers and, therefore, only the thickness of the TIB was varied. This allowed investigation of the optimal thickness to reduce efficiency droop of the UV-LED.

Four UV-LEDs were made with the epitaxial structure shown in FIG. 4, but with different thicknesses of the TIB layer. The thicknesses were 0.5 nm (sample V2769-D), 1 nm (sample V2769-C), 2 nm (sample V2769-B), and 3 nm (Sample V2769-A). As can be seen from Table 2, 0.5 nm is out of the predicted range and 3 nm is exactly at the upper limit of the predicted range for TIB thickness. All 4 LED wafers were processed into devices simultaneously using the same processing steps and conditions, having the same chip-size (300 μm×300 μm), metal contact design (n-metal was Ti/Al/Ti/Au or V/Al/V/Au; p-metal was Ni/Au) and measured the same way.

Figure 5:
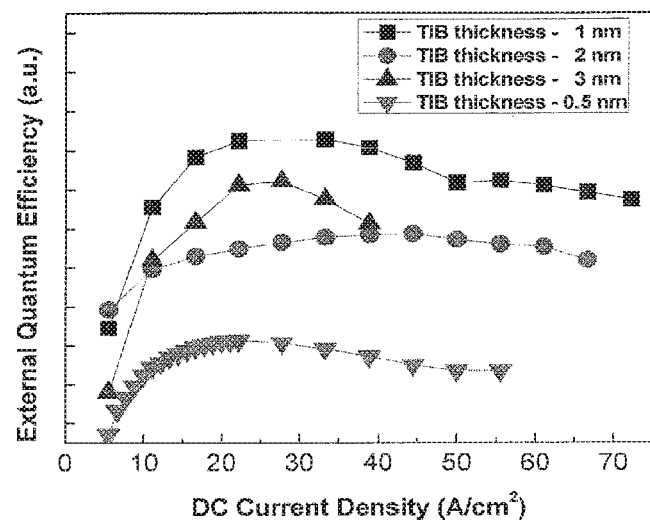
FIG. 5 shows the external quantum efficiency (EQE) as a function of current density for several UV-LEDs differing in the thickness of the inner barrier (TIB) layer. Sample V2769-A—TIB thickness of 3 nm. Sample V2769-B—TIB thickness of 2 nm. Sample V2769-C—TIB thickness of 1 nm. Sample V2769-D—TIB thickness of 0.5 nm)
Figure 6:
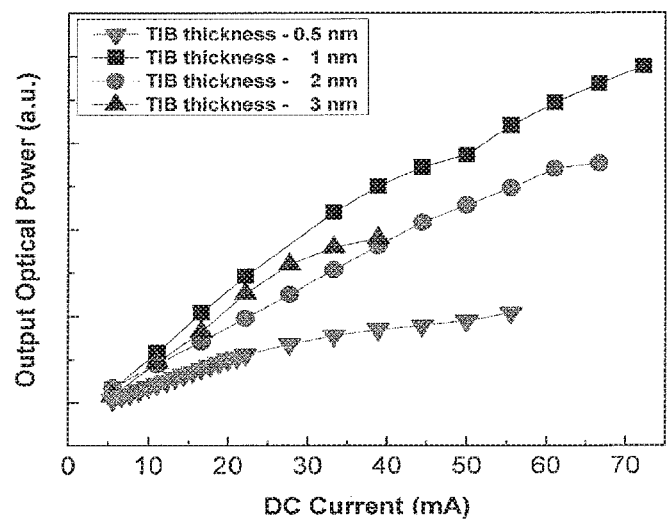
FIG. 6 shows the optical output power as a function of drive current for the same UV-LEDs described in FIG. 5.

The EQE results as a function of drive current for the 4 LEDs with different TIB layer thickness are shown in FIG. 5. In FIG. 6, the output power of these 4 LEDs with different TIB layer thickness is shown as a function of current density.

As discussed above and shown in FIG. 2, different TIB layer thickness leads to different wave function (and carrier distribution) across the two adjacent wells. Because the hole transport in AlGaN-based LEDs is strongly hindered by the low free hole concentration and low mobility due to large effective mass, without sufficient carrier transport and spreading, the holes are mainly located in the well adjacent to the last (i.e., p-side) barrier. Therefore, when the TIB layer was thick (3 nm), effectively only the well adjacent to the last barrier was filled with holes, which is equivalent to having only one well. This leads to strong efficiency droop when the drive current density reached beyond the optimal carrier density for single quantum well. This effect is shown in FIG. 5, where the LED with 3 nm thick TIB layer reached peak EQE at 30 A/cm² drive current density and started to decrease drastically beyond 30 A/cm², indicating significant efficiency droop. When driven at 40 A/cm² current density the output power of this LED started to saturate and could not be evaluated at higher current due to complete power saturation (shown in FIG. 6), indicating pronounced efficiency droop. In comparison, when the TIB layer thickness was reduced to 2 nm, the EQE remained nearly constant (i.e., reduced efficiency droop) until after reaching its peak at 45 A/cm² current density, and the UV-LED could be driven at significantly higher current density of up to 70 A/cm² (shown in FIG. 5). This is also evidenced by the linear increase of output power of this LED up to 60 A/cm² shown in FIG. 6.

The best UV-LED performance was obtained when the TIB layer thickness was reduced to 1 nm, where the wave function overlap across the well layers is the strongest of the TIB thicknesses investigated. As shown in FIG. 5, this LED showed the highest EQE of all 4 devices, where the peak EQE was reached at 35 A/cm², and remained at the same level until the current density reached 70 A/cm². The output power of this device with 1 nm thick TIB layer increased linearly up to 70 A/cm², and produced the highest output power of the LEDs investigated (shown in FIG. 6).

When the thickness of the TIB layer was further reduced to 0.5 nm, the EQE of the LED was found to be much lower than for the other LEDs due to strong QCSE and therefore electron-hole wave-function separation. Therefore, although this UV-LED could be driven at higher current density than the UV-LED with TIB thickness of 3 nm, the EQE of this device was low, independent of its efficiency droop characteristics. This UV-LED also exhibited significantly lower power output than the other UV-LEDs.

Example 2. Effect of Tunable Barrier Layer Thickness on Emission Spectrum

Figure 7:
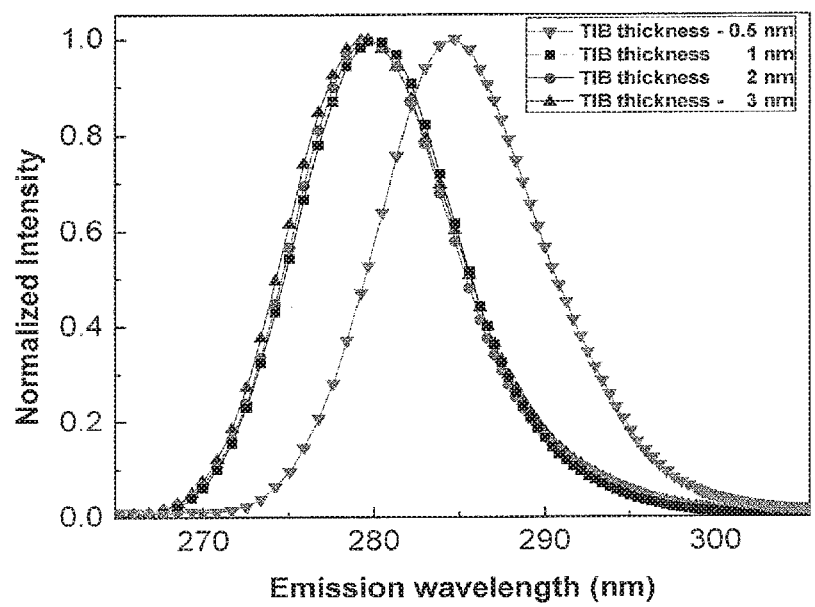
FIG. 7 shows the emission spectra of 4 UV-LEDs having different TIB layer thickness. Sample V2769-A—TIB thickness of 3 nm. Sample V2769-B—TIB thickness of 2 nm. Sample V2769-C—TIB thickness of 1 nm. Sample V2769-D—TIB thickness of 0.5 nm.

The emission spectra of the 4 LEDs with different TIB layer thickness described in Example 1 was investigated. The results are shown in FIG. 7. As the TIB layer thickness was reduced from 3 nm to 1 nm, a slight red-shift in the emission spectra was observed. However, when the TIB thickness was reduced to 0.5 nm, wave-function delocalization took place, and strong QCSE further red shifted the emission spectrum by 5 nm.

Figure 8:
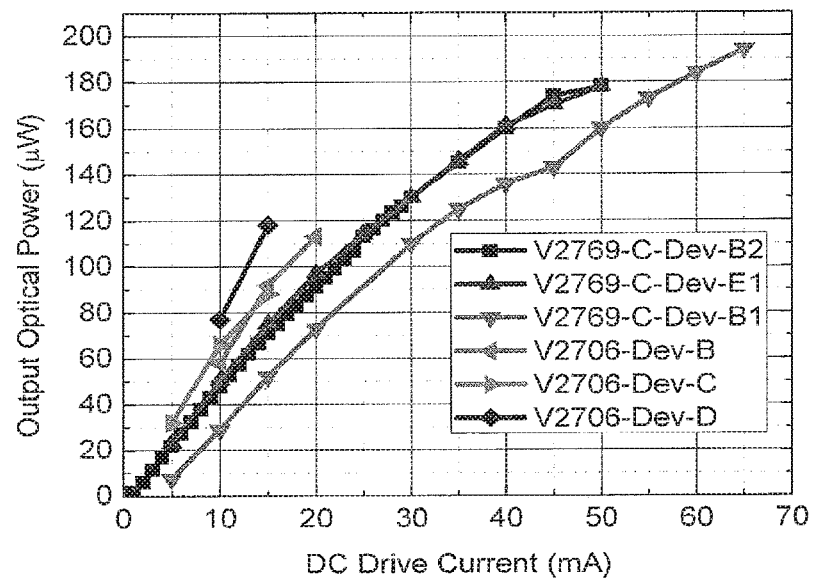
FIG. 8 shows the optical output power as a function of the drive current for UV-LEDs having single quantum wells or multiple quantum wells with tuned inner barrier layers.
Figure 9:
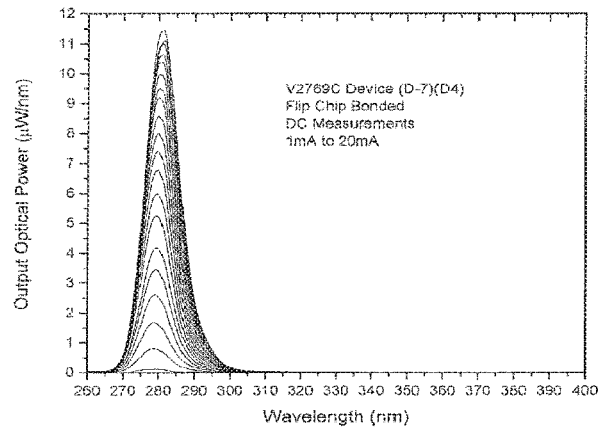
FIG. 9 shows LED emission spectra and FIG. 10 shows L-I characteristics of UV-LEDs with optimized TIB layer thickness of 1 nm (sample V2769-C)
Figure 10:
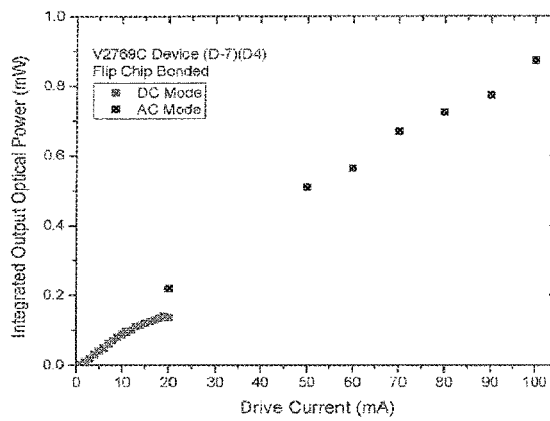
Figure 11:
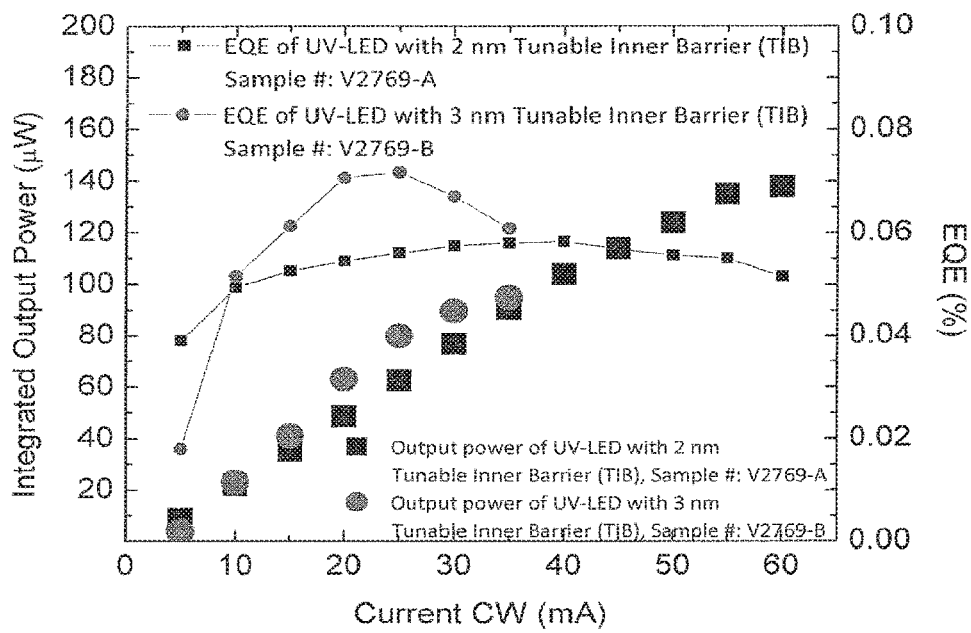
FIG. 11 shows integrated output power and EQE as a function of drive current for UV-LEDs with 2 nm (V2769-B) and 3 nm (V2769-A) TIB thicknesses.
Figure 12:
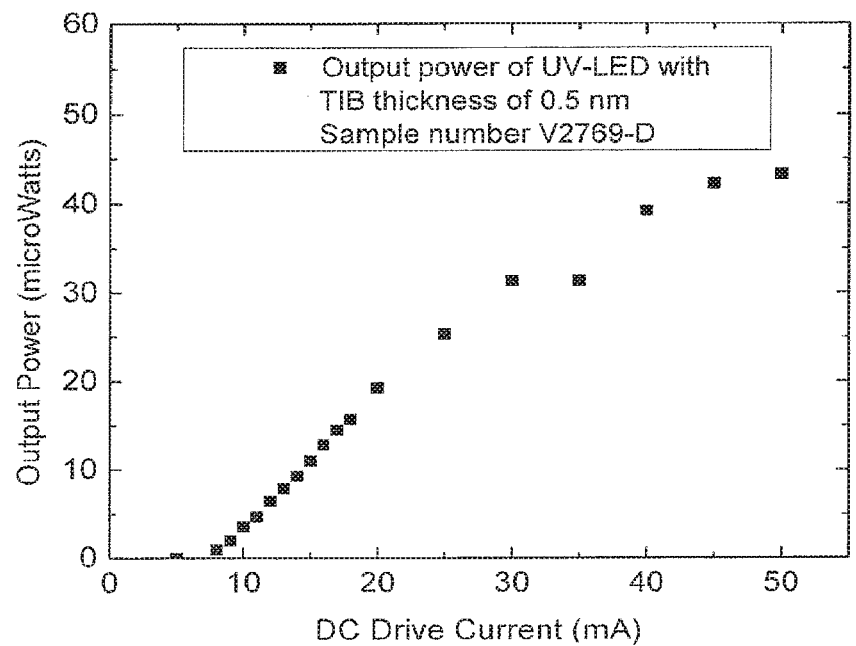
FIG. 12 shows output power as s function of drive current.
Figure 13:
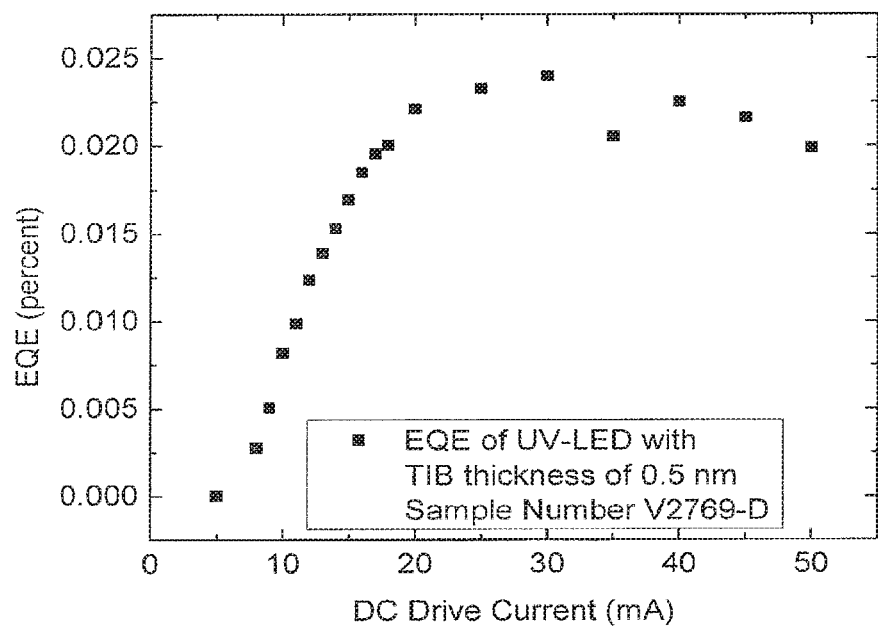
FIG. 13 shows EQE as a function of drive current.
Figure 14:
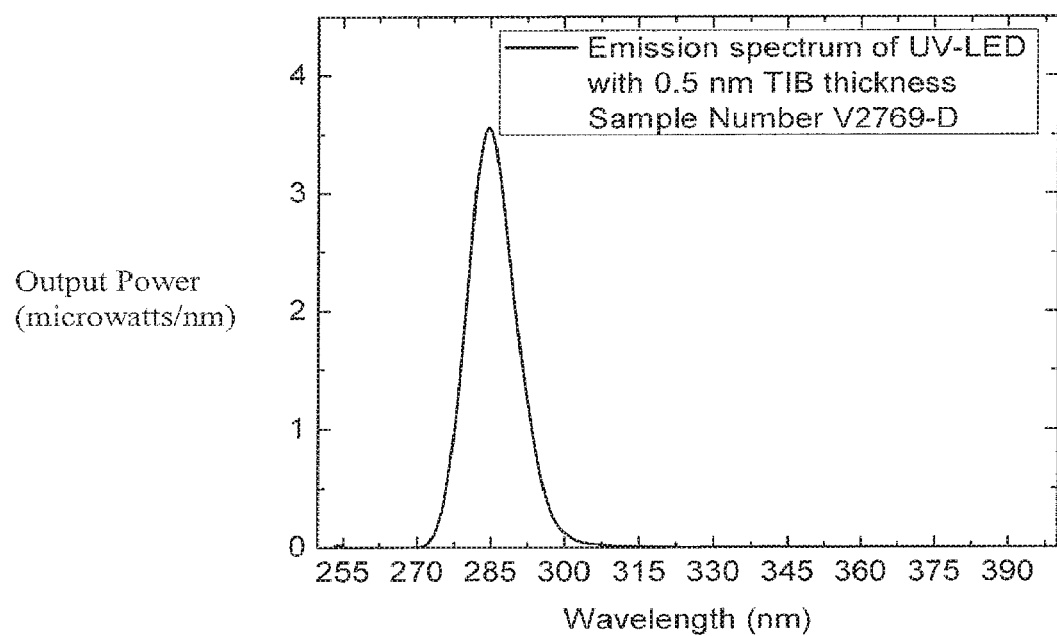
FIG. 14 shows emission spectra for Sample V2769-D UV-LED with 0.5 nm TIB layer thickness.

Example 3. Effect of Tunable Inner Barrier Layer Optimization on High Current Density Operation Comparing UV-LEDs with multiple quantum wells separated by TIB barrier layers (V2769-C, devices B2, E1 and B1) to enhance carrier transport and wave-function overlap to a single quantum well UV-LED (V2706, devices B, C, and D), it was discovered that the UV-LED with a tuned inner barrier layer could be driven at much higher current density than a single quantum well LED without power output saturation (FIG. 8). This is indicative of the ability of the UV-LED with a tuned inner barrier layer to spread the injected carriers across the multiple quantum wells (two wells in this case). Therefore, at the same drive current the carrier density in the well was lower than for single quantum well UV-LEDs.

Example 4. Characterization of UV-LEDs Made with Optimized Tunable Inner Barrier Layer

TABLE 6 presents wafer level testing results from Sample V2769-C, containing serveral UV-LEDs with a TIB layer thickness of 1 nm.

| Table 6 | WAFERLEVEL | | | |
|---|---|---|---|---|
| V2769C DEVICE | Voltage Drop at 20 mA DC (Volts) | Optical Power (microW) | Peak Position (nm) | FWHM (nm) |
| (C-7)(D3) | 20.02 | 49.55 | 279.9 | 10.68 |
| (D-7)(D4) | 16.64 | 82.32 | 279.26 | 10.73 |
| (E-5)((A5) | 14.78 | 53.38 | 278.42 | 10.24 |
| (E-7)(D5) | 15.93 | 95.18 | 279.26 | 10.65 |
| (E-8)(C5) | 14.75 | 73.58 | 279.9 | 10.67 |
| (H-3)(C3) | 16.6 | 53.13 | 279.26 | 10.48 |
| (H-5)(A3) | 14 | 55.9 | 279.26 | 10.42 |
| (I-4)(B4) | 16.04 | 90.64 | 279.26 | 10.52 |
| (J-3)(C5) | 15.85 | 57.82 | 279.47 | 10.48 |

Bare-die and flip-chip bonded device testing results from sample V2769-C UV-LEDs with optimized TIB layer thickness of 1 nm are presented in Table 7.

TABLE 7

| | DICED DEVICES DC testing | | | | FLIP CHIP BONDED DEVICES DC testing | | | | FLIP CHIP BONDED DEVICES Pulsed testing | | |
|---|---|---|---|---|---|---|---|---|---|---|---|
| DEVICE | Drive Current (mA) | Voltage Drop (mA) | Optical Power (microW) | Peak Position (nm) | Drive Current (mA) | Voltage Drop (mA) | Optical Power (microW) | Peak Position (nm) | Drive Current (mA) 10 kHz, 5% Duty Cycle | Optical Power (microW) | Peak Position (nm) |
| (C-7)(D3) | 20 | 18.72 | 57.36 | 281.37 | | | | | | | |
| (D-7)(D4) | | | | | 20 | 16.7 | 136.8 | 281.37 | 100 | 874 | 279 |
| (E-5)(A5) | 20 | 13.82 | 54.9 | 280.53 | 20 | 13.99 | 148.9 | 279.9 | 100 | 924 | 278.84 |
| (E-7)(D5) | | | | | 20 | 15.75 | 116.51 | 280.32 | 50 | 316 | 279.26 |

TABLE 7-continued

| | DICED DEVICES DC testing | | | | FLIP CHIP BONDED DEVICES DC testing | | | | FLIP CHIP BONDED DEVICES Pulsed testing | | |
|---|---|---|---|---|---|---|---|---|---|---|---|
| | | | | | | | | | Drive Current (mA) 10 kHz, | | |
| DEVICE | Drive Current (mA) | Voltage Drop (mA) | Optical Power (microW) | Peak Position (nm) | Drive Current (mA) | Voltage Drop (mA) | Optical Power (microW) | Peak Position (nm) | 5% Duty Cycle | Optical Power (microW) | Peak Position (nm) |
| (E-8)(C5) | | | | | 20 | 14.42 | 171 | 280.11 | 100 | 864 | 279.9 |
| (H-3)(C3) | 20 | 15.44 | 60.3 | 280.95 | 20 | 15.06 | 105.3 | 280.95 | 100 | 700 | 279.47 |
| (H-5)(A3) | 20 | 14.42 | 70 | 280.95 | 20 | 13.64 | 120.88 | 280.11 | 100 | 1040 | 279.69 |
| (I-4)(B4) | 20 | 15.7 | 64.4 | 281.37 | 13 | 14.4 | 132.9 | 279.9 | 100 | 956 | 279.9 |
| (J-3)(C5) | | | | | 20 | 15.16 | 93.29 | 280.95 | 100 | 775 | 279.26 |

Sample V2769-A with 3 nm TIB thickness showed efficiency droop starting at 20 mA accompanied with power saturation at 30 mA, where the LED could not continue to produce additional power output by further increasing the current. Beyond 30 mA the output power started to saturate and decline.

Sample V2769-B with 2 nm TIB thickness showed different efficiency behavior with increased drive current. The efficiency of the device was much more stable than V2769-A. It peaked at 35 mA and did not show significant degradation until 60 mA DC drive current. Even at current as high as 60 mA DC, no significant output power degradation was observed in Sample V2769-B, compared to V2769-A. The results suggest that in Sample V2769-A only 1 quantum well worked effectively and was quickly saturated at high current density at 30 mA, while in Sample V2769-B the two quantum wells contributed to carrier recombination due to reduced TIB thickness and improved carrier transport between the two quantum wells. Therefore, the current density started to saturate at 60 mA, about twice the case of a single QW LED (V2769-A).

Further Embodiments of the Invention

1) A semiconductor light emitting device structure grown on a substrate, where a buffer layer is grown on said substrate followed by an n-type layer, an active region where the light is generated, an electron blocking layer, and a p-type layer; the active region consists of multiple quantum wells structure consisting of at least two quantum well layers, where a first barrier is grown on top of the last n-doped layer, a first quantum well layer is grown on top of the first barrier, a tunable inner barrier is grown on the first quantum well layer, a second quantum well layer is grown on the tunable inner barrier, and a last barrier grown on top of the second quantum well layer, followed by the electron blocking layer and a p-type layer; The thickness, potential energy, or both of the tunable inner barrier layers separating the quantum well layers is different from the thickness, potential energy, or both of the first or last barrier.
2) The semiconductor light emitting device structure described in embodiment 1), where the emission wavelength is in the ultraviolet region from 360 nm to 210 nm.
3) The semiconductor light emitting device structure described in embodiment 1), where the device is made essentially of III-N material.
4) The semiconductor light emitting device structure described in embodiment 1), where the active region of the light emitting structure is made of InAlGaN quaternary;
5) The semiconductor light emitting device structure described in embodiment 2), where the active region of the light emitting structure is made of AlGaN alloy;
6) The semiconductor light emitting device structure described in embodiment 1), where the structure can be a light emitting diode, a laser diode and a quantum well light emitting structure without n-type or p-type layers and externally pumped by a light source or an electron beam source.
7) The semiconductor light emitting structure described in embodiment 5), where the first and last barriers have substantially the same thickness
8) The semiconductor light emitting structure described in embodiment 5), where the first and last barriers have substantially the same potential energy
9) The semiconductor light emitting structure described in embodiment 5), where the groups of layers consisting of the first and last barriers, the first and second quantum well layers, and the tunable inner barrier, is repeated two or more times successively as the active region of the device.
10) The active region described in embodiment 5), where the AlN mole fraction in the quantum well layers ranges from 0% to 100%
11) The quantum well layers described in embodiment 10), where the AlN mole fraction in the well layers can be chosen from a range specified by a lower limit, a typical value and an upper limit given by the following table:

| LED emission wavelength (nm) | Upper AlN mole fraction | Lower AlN mole fraction | Typical AlN mole fraction |
|---|---|---|---|
| 340 to 360 | 20 | 0 | 5 |
| 320 to 340 | 35 | 10 | 15 |
| 300 to 320 | 45 | 20 | 35 |
| 280 to 300 | 65 | 30 | 50 |
| 260 to 280 | 80 | 40 | 65 |
| 240 to 260 | 90 | 65 | 75 |
| 220 to 240 | 100 | 70 | 85 |

12) The active region described in embodiment 5), where the AlN mole fraction in the first and last barriers ranges from 10% to 100%

13) The first and last barriers described in embodiment 12), where the AlN mole fraction in the first and last barriers can be chosen from a range specified by a lower limit, a typical value and an upper limit given by the following table:

| LED emission wavelength (nm) | Upper AlN mole fraction | Lower AlN mole fraction | Typical AlN mole fraction |
|---|---|---|---|
| 340 to 360 | 30 | 10 | 15 |
| 320 to 340 | 45 | 20 | 25 |
| 300 to 320 | 60 | 30 | 45 |
| 280 to 300 | 75 | 40 | 60 |
| 260 to 280 | 90 | 50 | 75 |
| 240 to 260 | 100 | 60 | 85 |
| 220 to 240 | 100 | 80 | 95 |

14) The active region of the light emitting device structure described in embodiment 10), where the quantum well layers consist of AlGaN alloy whose thickness ranges from 0.1 nm to 10 nm;

15) The active region of the light emitting device structure described in embodiment 12), where the first and last barrier thickness ranges from 0.1 nm to 10 nm.

16) The first and last barrier described in embodiment 15), where the thickness of the first and last barrier can be chosen from a range specified by a lower limit, a typical value and an upper limit given by the table below:

| LED emission wavelength (nm) | Upper thickness limit (nm) | Lower thickness limit (nm) | Typical thickness (nm) |
|---|---|---|---|
| 340 to 360 | 15 | 5 | 8 |
| 320 to 340 | 8 | 4 | 6 |
| 300 to 320 | 7 | 2 | 4 |
| 280 to 300 | 6 | 1.5 | 3 |
| 260 to 280 | 5 | 1 | 3 |
| 240 to 260 | 4 | 1 | 2 |
| 220 to 240 | 3 | 0.5 | 1 |

17) The active region of the light emitting device structure described in embodiment 1), where the tunable inner barrier thickness ranges from 0.1 nm to 10 nm, and is different from the thickness of the first and last barrier layers.

18) The tunable inner barrier described in embodiment 17), where the tunable inner barrier and the first and last barrier all have the substantially the same potential energy and AlN mole fraction 19) The active region of the light emitting device structure described in embodiment 17), where the tunable inner barrier thickness ranges from 0.1 nm to 10 nm, and is thinner than the thickness of the first and last barrier layers.

20) The tunable inner barrier layer described in embodiment 17), where the thickness of the tunable inner barrier can be chosen from a range specified a lower limit, a typical value, and an upper limit given by the table below:

| LED emission wavelength (nm) | Upper thickness limit (nm) | Lower thickness limit (nm) | Typical thickness (nm) |
|---|---|---|---|
| 340 to 360 | 8 | 3 | 5 |
| 320 to 340 | 7 | 3 | 4 |
| 300 to 320 | 5 | 2 | 3 |
| 280 to 300 | 4 | 1 | 2 |
| 260 to 280 | 3 | 1 | 1 |
| 240 to 260 | 3 | 0.5 | 1 |
| 220 to 240 | 2 | 0.1 | 0.5 |

21) The tunable inner barrier described in embodiment 1), where the tunable inner barrier has the substantially the same thickness as the first and last barrier layers.

22) The active region described in embodiment 1), where the quantum well, first and last barriers have AlN mole fraction have AlN mole fraction described in embodiments 10), 11), 12) and 13)

23) The first and last barrier layers described in embodiment 15), where the first and last barriers have substantially the same AlN mole fraction 24) The tunable inner barrier described in embodiment 21), where the tunable inner barrier has AlN mole fraction different than the first and last barrier layers 25) The tunable inner barrier described in embodiment 24), where the tunable inner barrier has AlN mole fraction less than the first and last barrier layers 26) The tunable inner barrier described in embodiment 24), where the AlN mole fraction of the tunable inner barrier can be chosen from a range specified by a lower limit, a typical value, and an upper limit given by the table below:

| LED emission wavelength (nm) | Upper AlN mole fraction | Lower AlN mole fraction | Typical AlN mole fraction |
|---|---|---|---|
| 340 to 360 | 25 | 5 | 10 |
| 320 to 340 | 40 | 15 | 20 |
| 300 to 320 | 50 | 25 | 30 |
| 280 to 300 | 70 | 35 | 55 |
| 260 to 280 | 85 | 45 | 70 |
| 240 to 260 | 95 | 70 | 80 |
| 220 to 240 | 100 | 75 | 90 |

27) The light emitting device described in embodiment 1), where the device is an ultraviolet light emitting diode emitting in the wavelength range between 360 nm and 210 nm.

28) The UV light emitting diode (LED) described in embodiment 27), where the LED has a tunable inner barrier in the active region having substantially the same potential energy as the first and last barrier layers, and thinner thickness compared to the first and last barrier layers.

29) The UV-LED described in embodiment 27), where the UV-LED efficiency remain stable near its peak efficiency when the drive current reach 70 A/cm$^2$ 30) The UV-LED described in embodiment 27), where the UV-LED output power keeps increasing without saturation when the drive current reach 70 A/cm$^2$ 31) The UV-LED described in embodiment 27), where the LED has a tunable inner barrier in the active region having substantially the same thickness as the first and last barrier layers, and lower potential energy compared to the first and last barrier layers.

32) The UV-LED described in embodiment 31), where the UV-LED efficiency remain stable near its peak efficiency when the drive current reach 70 A/cm$^2$ 33) The UV-LED described in embodiment 31), where the UV-LED output power keeps increasing without saturation when the drive current reach 70 A/cm$^2$ 34) The UV-LED described in embodiment 27), where the LED has a tunable inner barrier in the active region having thinner thickness as the first and last barrier layers, and lower potential energy compared to the first and last barrier layers.

35) The UV-LED described in embodiment 34), where the UV-LED efficiency remain stable near its peak efficiency when the drive current reach 70 A/cm$^2$ 36) The UV-LED described in embodiment 34), where the UV-LED output power keeps increasing without saturation when the drive current reach 70 A/cm$^2$

What is claimed is:

1. A method comprising:
   depositing a buffer layer on a substrate;
   depositing an n-type layer on the buffer layer;
   depositing an active region on the n-type layer, the active region comprising:
   a first barrier disposed proximate the n-type region;
   a first quantum well layer;
   a tunable inner barrier;
   a second quantum well layer, wherein the tunable inner barrier is disposed between the first quantum well layer and the second quantum well layer;
   a last barrier, wherein the first quantum well layer and the second quantum well layer are disposed between the first barrier and the last barrier;
   wherein the tunable inner barrier has a thickness less than a thickness of both the first barrier and the last barrier, where the thickness of the inner barrier is greater than 0.5 nm and less than 2 nm, and wherein the inner barrier is Al$_x$Ga$_{1-x}$N, having a mole fraction of AlN between 50-85, which is less than an AlN mole fraction in the first barrier and last barrier; and
   depositing a p-type region on the active region, wherein the active region emits UV light in the range of 220-300 nm.

2. The method of claim 1 wherein said depositing an active region comprises subjecting the n-type material to a flux of an elemental gallium material to cause formation of a thickness of gallium material during said depositing the active region.

3. The method of claim 1 wherein said depositing a buffer layer, depositing an n-type layer, depositing an active region, and depositing a p-type region occur in a process chamber, where said depositing an active region comprises maintaining the process chamber under a vacuum environment of no greater than 10$^{-1}$ Torr.

4. The method of claim 1 wherein the first quantum well layer has a thickness between 0.1 nm and 10 nm.

5. The method of claim 1 wherein the tunable inner barrier has a mole fraction of AlN greater than 55% and less than 85.

6. The method of claim 1 wherein the tunable inner barrier has a potential energy lower than that of the first barrier.

* * * * *